US008710714B2

(12) United States Patent
Loi et al.

(10) Patent No.: US 8,710,714 B2
(45) Date of Patent: Apr. 29, 2014

(54) SURFACE ACOUSTIC WAVE RESONATOR FOR DOWN-HOLE APPLICATIONS

(75) Inventors: Duke Loi, Frisco, TX (US); Tim Mueller, Plano, TX (US); Kathleen Hanafan, Sugar Land, TX (US)

(73) Assignee: HM Energy, LLC, Houston, TX (US)

( * ) Notice: Subject to any disclaimer, the term of this patent is extended or adjusted under 35 U.S.C. 154(b) by 447 days.

(21) Appl. No.: 13/188,767

(22) Filed: Jul. 22, 2011

(65) Prior Publication Data

US 2012/0020183 A1   Jan. 26, 2012

Related U.S. Application Data

(60) Provisional application No. 61/366,784, filed on Jul. 22, 2010, provisional application No. 61/366,795, filed on Jul. 22, 2010, provisional application No. 61/436,918, filed on Jan. 27, 2011.

(51) Int. Cl.
*H03H 9/25* (2006.01)

(52) U.S. Cl.
USPC .............. 310/313 R; 310/313 D; 310/348; 310/344

(58) Field of Classification Search
USPC ...... 310/313 A, 313 B, 313 C, 313 R, 313 D, 310/324, 344, 348; 333/193–199; 235/492, 235/375, 451
IPC ............................. H04H 1/59; H03H 9/25,9/00
See application file for complete search history.

(56) References Cited

U.S. PATENT DOCUMENTS

| 7,407,111 | B2* | 8/2008 | Hartmann | 235/492 |
|---|---|---|---|---|
| 8,496,184 | B2* | 7/2013 | Loi et al. | 235/492 |
| 2005/0035829 | A1* | 2/2005 | Umeda et al. | 333/191 |
| 2005/0104685 | A1 | 5/2005 | Kuroki et al. | |
| 2005/0237130 | A1 | 10/2005 | Iwamoto et al. | |
| 2007/0023185 | A1 | 2/2007 | Hall et al. | |
| 2009/0051246 | A1* | 2/2009 | Mueller | 310/313 R |

OTHER PUBLICATIONS

Patent Cooperation Treaty; Korean Intellectual Property Office; International Search Report of PCT/US2011/044976; Han Jae Guyn; Feb. 23, 2012; 3 pages.

* cited by examiner

*Primary Examiner* — Thomas Dougherty
*Assistant Examiner* — Karen B Addison
(74) *Attorney, Agent, or Firm* — Howison & Arnott, L.L.P.

(57) ABSTRACT

A method and apparatus for packaging a Surface Acoustic Wave (SAW) piezoelectric device into a SAW tagging device for use in a harsh environment is provided. An exemplary SAW tagging device comprises a SAW piezoelectric device within a header container. The header container is electrically connected to an antenna system that comprises an antenna substrate, a dielectric disk that may operate as an antenna reflector in combination with a metal base. The antenna system, antenna substrate, dielectric disk and header container are all contained within a cavity in the metal base. The SAW tagging device is completely encased in a chemical, temperature and environmentally resistive and durable material that is transparent to the operating radio frequency of the SAW piezoelectric device contained therein. A grooved sleeve or ring is provided about the SAW tagging device and is compressible or crushable such that the SAW tagging device can be compression fitted into a borehole in an asset or object in need of being tagged.

19 Claims, 4 Drawing Sheets

SURFACE ACOUSTIC WAVE RESONATOR FOR DOWN-HOLE APPLICATIONS

CROSS-REFERENCE TO RELATED APPLICATIONS

This application claims benefit from of U.S. Provisional Application No. 61/366,784, filed Jul. 22, 2010, entitled METHOD AND APPARATUS FOR PACKAGING SURFACE ACOUSTIC WAVE TRANSPONDER FOR DOWN-HOLE APPLICATIONS; this application also claims benefit from U.S. Provisional Application No. 61/366,795, filed Jul. 22, 2010, entitled SURFACE ACOUSTIC WAVE RESONATOR DEVICE FOR DOWN-HOLE APPLICATIONS; this application also claims benefit from U.S. Provisional Application No. 61/436,918, filed Jan. 27, 2011, entitled METHOD AND APPARATUS FOR PACKAGING SURFACE ACOUSTIC WAVE TRANSPONDER FOR DOWN-HOLE TOOLS, the specifications of which are incorporated herein in by reference.

TECHNICAL FIELD

Embodiments of the present invention relate to methods, apparatus, packaging and identification tag circuits for use and installation on equipment assets used in oil and gas down-hole applications. More specifically, embodiments of the invention relate to methods and apparatus for packaging Surface Acoustic Wave (SAW) Radio Frequency Identification (RFID) transponders in a durable manner for use on equipment assets used in oil and gas down-hole applications.

BACKGROUND

Oil exploration companies involved in the drilling, completion and production phases of oil and gas well installations use hundreds, if not thousands, of down-hole tools such as tubulars, drill bits, mud motors, power packs, etc. while drilling, exploring and completing oil and gas wells. Some technologies have been utilized in the recent past to help such companies log individual tools into inventory; track usage of individual tools in drilling, completion and production operations; and ultimately record the removal of individual tools from inventory when their usefulness has expired.

There have been systems created for managing inventories of down-hole tools or assets that are used in the drilling, completion, and production phases of oil and gas wells. In some such systems, a passive silicon chip RFID tag is installed on each asset and recorded or logged in inventory. By providing each tool or asset with an RFID tag, the asset can be tracked throughout its useful life. One example of such a system for managing inventories comprising down-hole tools used in drilling, completion and production of oil and gas wells is discussed in U.S. Publication No. 2009/0055293. One drawback of silicon chip RFID devices is their inability to withstand the vibration on high temperatures associated with down-hole environments.

U.S. Pat. No. 7,602,106 discloses a radio frequency identification (RFID) piezoelectric device package comprising a plethora of components including a hermetically sealed device header that contains the piezoelectric device, which is then installed into the bottom of a radome along with an RF antenna, along with an impedance matching network and other elements. A drawback of such a device is the manufacturing complexity and the number of parts required to assemble the requisite piezoelectric RFID device.

As such, what is needed is an improved down-hole asset tagging device package that can withstand the high pressures, high temperatures as well as the acidic and caustic environments that exist in the down-hole portions of oil and gas wells and that is less complex and less expensive to manufacture than previous devices.

SUMMARY

Embodiments of the invention provide an improved down-hole asset tagging device package that can withstand the high temperatures, pressures and vibrations as well as the acidic and caustic environments in down-hole environments associated with oil and gas exploration.

For a variety of reasons, including inventory, identification, ownership, life-of-use, and pedigree of an asset, tagging of down-hole assets has become extremely important in the oil exploration industry. Additional important reasons for tagging and tracking assets may be for keeping track of assets, for pipe tally automation, for real-time monitoring, for pedigree and logistics tracking of assets, or for asset and inventory management. Surface Acoustic Wave (SAW) technology used in exemplary embodiments of the invention provides a unique ability to function accurately and without failure after encountering or while within a wide temperature range. Additionally, performance capabilities of an exemplary SAW tagging device greatly exceeds the traditional semiconductor Radio Frequency Identification (RFID) silicon based technologies used in the past. Exemplary SAW tagging devices are able to withstand extreme pressures and temperatures present in down-hole environments for at least the lifetime of the asset in which an exemplary SAW tagging device is installed. Furthermore, an exemplary SAW tagging device can be read or interrogated from a workable distance of up to about 6 to 8 feet by an exemplary interrogation device when a SAW tagging device returns to the surface from down-hole use. With an exemplary designed interrogator device, an exemplary SAW tagging device can be read easily, and in some embodiments can be read at a distance or distances extending into or within the down-hole environment.

Unlike prior semiconductor RFID devices, exemplary SAW tagging devices require that there be at least a small amount of gas on a surface of the surface acoustic wave piezoelectric device portion of an exemplary SAW tagging device to enable surface acoustic wave propagation thereon. Embodiments of the invention, as described and illustrated herein, provide a method and apparatus for packaging Surface Acoustic Wave RFID resonators together with a specially designed antenna system all within a novel and useful durable package that provides a long read/interrogate distance as well as the ability to withstand high pressures, vibration, and a large temperature range within a caustic environment.

Embodiments of the invention provide a surface acoustic wave (SAW) tagging device. An exemplary SAW tagging device may comprise a base that has a lower cavity and an upper cavity being adjacent to each other, the base may be made of an electrically conductive material; a dielectric or ceramic disk having a lower surface and an upper surface, the dielectric disk adapted to fit in the upper cavity. The dielectric disk may also have a first through hole extending from its lower surface to its upper surface. Embodiments may also have an antenna substrate having a top surface and a bottom surface. The antenna substrate has at least a first via extending from the top surface to the bottom surface. The antenna substrate is adapted to fit in the upper cavity and on top of the dielectric disk. There is an antenna system on the top surface of the antenna substrate. Also, there is a hermetically sealed enclosure comprising a SAW piezoelectric device in an interior of the enclosure and at least one electrically conductive connection extending from the interior of the enclosure to the exterior of the hermetically sealed enclosure. A first electrically conductive connection of the at least one electrically conductive connection is electrically connected to the SAW piezoelectric device. The hermetically sealed enclosure is also adapted to fit in the lower cavity in a position below and adjacent to the dielectric disk such that the first conductive connection extends through the first through hole and through the first via to electrically connect to the antenna system. And, a radio frequency transparent material is on the exterior surfaces of base, the antenna substrate, the antenna system.

In additional embodiments, the tagging device further includes a grooved compressible ring about an exterior surface of the radio frequency transparent material.

In some embodiments, the radio frequency transparent material about the tagging device is transparent to a radio frequency which the SAW piezoelectric device is adapted to receive or transmit.

Yet additional embodiments comprise a tagging device wherein the radio frequency transparent material is electrically conductive and the grooved compressible ring is electrically conductive thereby establishing a ground path from the antenna system to the base to the radio frequency transparent material to the grooved compressible ring.

Additional embodiments of an exemplary tagging device are constructed such that the base, the hermetically sealed enclosure, the dielectric disk, the antenna substrate and antenna system are positioned to create monolithic characteristics (i.e., a substantially monolithic device) in the tagging device.

Yet other embodiments provide a surface acoustic wave transponder tagging device comprising a construction having monolithic characteristics comprising an antenna system on top of an antenna substrate on top of a dielectric disk on top of a hermetically sealed surface acoustic wave piezoelectric device, wherein the surface acoustic wave piezoelectric device is electrically connected to the antenna system; and a radio frequency transparent material encasing the construction having monolithic characteristics, the radio frequency transparent material being transparent to a radio frequency to which the surface acoustic wave piezoelectric device receives or transmits.

Additionally, an embodiment of the tagging device may be constructed such that the monolithic characteristics further comprise a base having at least one interior cavity adapted to contain the antenna system, the antenna substrate, the dielectric disk and the hermetically sealed surface acoustic wave piezoelectric device wherein the antenna system is proximate to an open end of the cavity.

Other embodiments provide a surface acoustic wave tagging device comprising a surface acoustic wave piezoelectric device hermetically sealed within the surface acoustic wave tagging device; a structure having substantially monolithic characteristics that comprise (a) a cylindrical base comprising a cavity having an open end of the cavity at one end of the cylindrical base; (b) an antenna system on a top surface of an antenna substrate positioned at the open end of the cavity; and (c) a dielectric disk positioned inside the cavity and against a bottom surface of the antenna substrate; and a radio frequency transparent material encasing the substantially monolithic structure; and wherein the surface acoustic wave piezoelectric device is electrically connected to the antenna system.

BRIEF DESCRIPTION OF THE DRAWINGS

A more complete understanding of the methods and embodiments associated with the present invention may be obtained by reference to the following Detailed Description when taken in conjunction with the accompanying drawings wherein.

DETAILED DESCRIPTION

Figure 1:
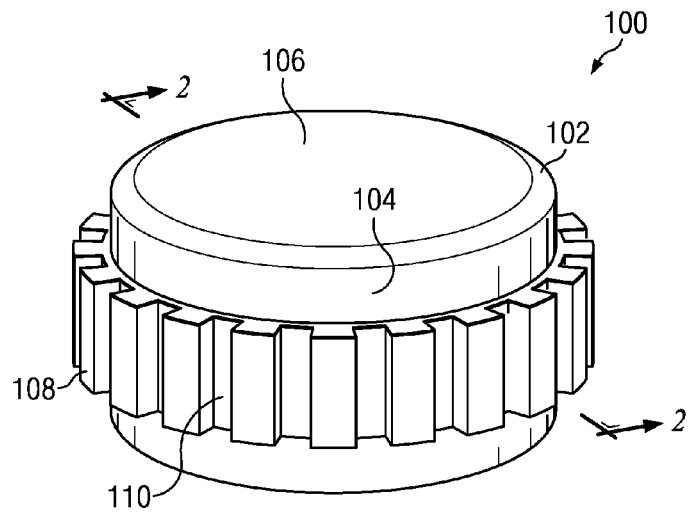
FIG. 1 is a perspective view of an exemplary surface acoustic wave tagging device.

Referring to the drawings, wherein like reference numbers are used herein to designate like elements throughout, the views and embodiments of exemplary Surface Acoustic Wave (SAW) transponder packages or tagging devices for down-hole applications are illustrated and described. Other possible embodiments are also described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

In general, a method and apparatus for packaging a SAW piezoelectric device for down-hole applications is provided. A resonator device used in an exemplary embodiment may include a SAW piezoelectric device, wire bonds, an antenna, a reflector, a base cavity, a radome casing, and a grooved sleeve. The grooved sleeve may encircle a radome and help provide a hermetically sealed enclosure for the SAW piezoelectric device. Embodiments comprise a puff of a predetermined gas is encased about or above a surface of the SAW piezoelectric device within a hermetically sealed enclosure so as to enable acoustic wave propagation on the SAW piezoelectric device. The plurality of components are enclosed and sealed within the radome encasing or cover layer. The radome, in some embodiments, is inserted into a grooved sleeve prior to installation into a milled hole receptacle in an asset. The grooved sleeve may also act as a ground coupling between an internal base cavity and an antenna system of a SAW tagging device and an asset. The grooved sleeve further includes at least one channel or annular portion that provides a means for pressure normalization between a back side of an exemplary device and the front side of the device when the device is installed in a milled hole or receptacle in the asset. The at least one channel or annular connection further helps to avoid explosive decompression events between an exemplary device and a milled hole or receptacle containing the device as an exemplary SAW tagging device is depressurized when being tripped out of a hole associated with the drilling rig.

Transponders that can withstand extreme environmental conditions of pressure and temperature are critical for certain industries, such as oil and gas exploration, deep ocean exploration, space exploration, mining, military testing and various manufacturing environments. Embodiments of the exemplary SAW tagging device provide methods and apparatus that effectively, efficiently and economically package a SAW piezoelectric device transponder for use in extreme environmental conditions such as those found in down-hole applications and other extreme environmental conditions. Some embodiments of the invention attach a hermetically sealed header containing a SAW piezoelectric device to the underside of an antenna system in a manner that protects such components from extreme environmental conditions by establishing an integrated sealed (and in some embodiments hermetically sealed) cavity comprising a radome portion may completely encases an exemplary SAW tagging device. Within the radome portion there is a metal base portion that contains a header device containing a SAW piezoelectric device hermetically sealed within. A ceramic disk and an antenna system are also contained within the base structure all of which is encased in the radome material.

Exemplary SAW tagging devices are adapted to withstand extreme temperatures of up to about 400° C. and pressures of up to about 1800 bars. Exemplary SAW tagging devices are further able to resist caustic materials found in oil and gas down-hole environments without degradation of functionality. An exemplary SAW tagging device installed within a tubular or other down-hole tool is designed to be operable and easily readable by an exemplary interrogator device immediately after retraction from a down-hole environment and/or upon return of an asset from a down-hole or other harsh pressure, temperature or caustic environment. It should be further understood that embodiments of the invention are also operable within a harsh pressure, temperature or caustic environment providing that a reader/interrogator device or an antenna for the reader/interrogator device is also located within such an environment.

An exemplary SAW tagging device receives radio frequency waves from an exemplary interrogator, processes that receive waves within the SAW piezoelectric device installed therein and reflects or returns a predetermined coded RF signal back to the interrogator. The interrogator then interprets the received coded radio frequency wave from the resonator device, which may essentially provide data in a digital form. The data provided in the reflected or return signal from an exemplary SAW tagging device may include, but is not limited to, an identification number, a manufacturer ID, a birth or installation date and perhaps a unique indicia or signal. The interrogation device may be connected to a controlling computer or other communication device, which accepts the data provided by an exemplary SAW tagging device and uses the received data or information for further processing, identification or a variety of other purposes.

Referring now to FIG. 1, an exemplary assembled SAW tagging device 100 is depicted. The exemplary SAW tagging device 100 comprises a radome 102 formed in a substantially cylindrical shape. The radome 102 has a cylindrical side 104. The radome 102 may be made of various radio frequency transparent materials including, but not limited to, a polyetheretherketone (PEEK) material or other semi-crystalline thermo plastic having similar mechanical and chemical resistance properties that do not diminish in high temperature environments in the range of up to about 350° to 400° C. An exemplary SAW tagging device 100 may have a diameter of between about 0.75 to about 2.0 inches across the top surface 106 of the cylindrical shaped radome covering. The height from the bottom surface to the top surface 106 may range from about 0.33 inches to about 0.5 inches.

A grooved sleeve or ring 108 encircles the cylindrical side 104 of the radome outer surface. The grooved sleeve 108 may be metallic or metallic composite or alloy that is partially crushable so as to aide in press-fitting an exemplary SAW tagging device 100 into a milled hole receptacle (not shown) on an asset. An exemplary grooved sleeve 108 may be a metal or metal alloy chosen because it is chemically resistant to sea water, hydrogen sulfide, carbon dioxide, nitrogen, bromine, chloride, down-hole drilling fluids as well as temperatures ranging from −55° C. to over 350° C. (−67° to 662° F.). An exemplary grooved sleeve 108 may be made of a nickel alloy or other electrically conductive metal that meets the necessary criteria. An exemplary grooved sleeve 108 may add an additional 0.08 to about 0.25 inches to the overall diameter of an exemplary SAW tagging device 100. The notches or grooves 110 in the grooved sleeve 108 extend continuously from the top of the grooved sleeve to the bottom of the grooved sleeve. The notches or grooves 110 may be vertically oriented, as shown, or be diagonal, zigzag or some other groove design so long as the notches or grooves 110 extend from the top to the bottom of the grooved sleeve 108. The grooves 110 are adapted to help balance the pressure between the bottom side and the top side 102 when installed in a milled bore hold in an asset.

The radome 102, being made of a radio frequency transparent material including, but not limited to PEEK material or another semi-crystalline thermo plastic, hermetically seals the internal components of an exemplary SAW tagging device 100 from pressure and caustic elements outside the radome 102. The PEEK or other RF transparent material may be molded about the internal components of an exemplary SAW tagging device 100 via injection molding, compression molding, over molding or other types of molding processes wherein composite materials can be added to the radome thereby establishing advanced thermoplastic composites incorporating carbon, glass or aramid continuous fibers. Some PEEK polymers as well as other semi-crystalline thermo plastics that can be used for the radome material 102 may also be conductive. As such, the exemplary grooved sleeve 108 in combination with a conductive radome material may comprise a means for grounding an exemplary SAW tagging devices antenna system by establishing an electrical coupling between an interior component of an exemplary SAW tagging device 100 and the exterior asset in which the SAW tagging device is ultimately installed.

Figure 2:
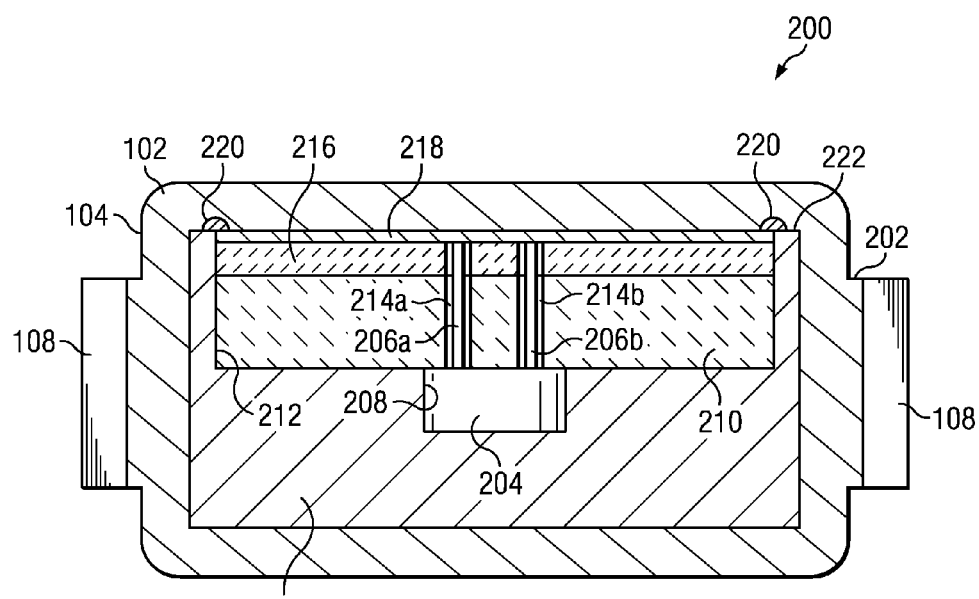
FIG. 2 is a cross section view of an exemplary surface acoustic wave tagging device in accordance with an embodiment of the invention.

Referring now to FIG. 2, a cross section view of an exemplary SAW tagging device 200 is shown. Here, the radome 102 is molded about the outer perimeter or exterior of the entire SAW tagging device 200. In some embodiments, an exemplary RF transparent radome 102 may also be made of a metal alloy or a predetermined type of stainless steel. About the circumference of the cylindrical side 104 of the radome 102 is the grooved sleeve 108. A grooved sleeve 108 may be slid about the circular circumference 104 of the radome 102. In other embodiments, the grooved sleeve 108 may be installed during an injection molding or compression molding process that produces the radome 102. Yet in additional embodiments, an adhesive or epoxy may form a partial or complete layer between the outer side surface 104 of the radome 102 and the inner surface of the grooved sleeve 108 so as to hold the grooved sleeve 108 in place prior to compression fitting the device into a milled hole receptacle on an asset. Additionally, additional embodiments may use ultrasonic or heat to weld or melt the grooved sleeve 108 into place about the radome 102.

The interior components of an exemplary SAW tagging device 200 are also shown. The interior components establish a substantially monolithic structure (i.e., a structure having monolithic characteristics). Inside a hermetically sealed enclosure or header 204, a SAW piezoelectric element (not shown in this figure) may be packaged such that two conductive leads 206a and 206b are electrically connected to the SAW piezoelectric element inside the header 204 and extend outward from the header package 204. A base 206, having a cylindrical exterior and a cavity therein, is made of a metal alloy, which is both mechanically strong and solderable. The metal alloy should also be conductive and in some embodiments not magnetic. The header 204 may be positioned in a central lower cavity 208 within the base 206. A dielectric disk 210, which in combination with the upper cavity 212 in which the dielectric disk is fitted within, operates as an antenna reflector. The conductive leads 206a and 206b extend through annular through holes 214a and 214b respectively, which extend from the bottom surface to the top surface of the electric disk 210. An antenna substrate disk 216 is positioned within the upper cavity 212 and on the top of the dielectric disk 210. On the top side of the antenna substrate 216 is an antenna system 218. The conductive leads 206a and 206b extend through vias within the antenna substrate 216 and electrically or conductively connect to the antenna system 218.

In some embodiments, an adhesive or epoxy layer is placed between one or more components inside the radome 102 so that the overall structure comprises monolithic characteristics and resists damage from vibration. A circumferential weld 220 welds the outer circumference or periphery of the antenna system 218 to the top circumferential edge 222 of the base 206. In some embodiments, the weld 220 establishes a hermetic seal about the entire circumference of the interface between the top of the base 222 and the outer parameter of the antenna system 218.

In some embodiments the annular through holes 214a, 214b are filled with a potting material, or ceramic material to help minimize vibrational stress on the conductive leads 206a and 206b so as to help eliminate vibrational based failures.

In some embodiments, the header 204, the antenna system and antenna substrate 218, 216 along with the antenna reflector dielectric disk 210 are all assembled or installed in the base 206 lower cavity 208 and upper cavity 212 by soldering or otherwise electrically connecting or crimping the perimeter of the antenna system 218 to the upper portion of the base cavity wall 222 so that the peripheral of the antenna system is grounded to the base 206. After the interior components are assembled, as discussed above, they are completely encased in or coated with high strength, RF transparent radome material that is made of PEEK, stainless steel or other material that is substantially interchangeable that are RF transparent for the RF frequency used by an exemplary SAW tagging device. In additional embodiments, after the assembled components are enclosed by the radome material 102, the grooved sleeve or ring 108 may or may not have an adhesive or epoxy placed on its interior surface. Regardless of whether an adhesive or epoxy is placed on the interior surface of the grooved sleeve 108, the grooved sleeve may then be installed about the sides 104 of the packaged exemplary components prior to pressure fitting the exemplary SAW tagging device 200 into a borehole within an asset.

Figure 3:
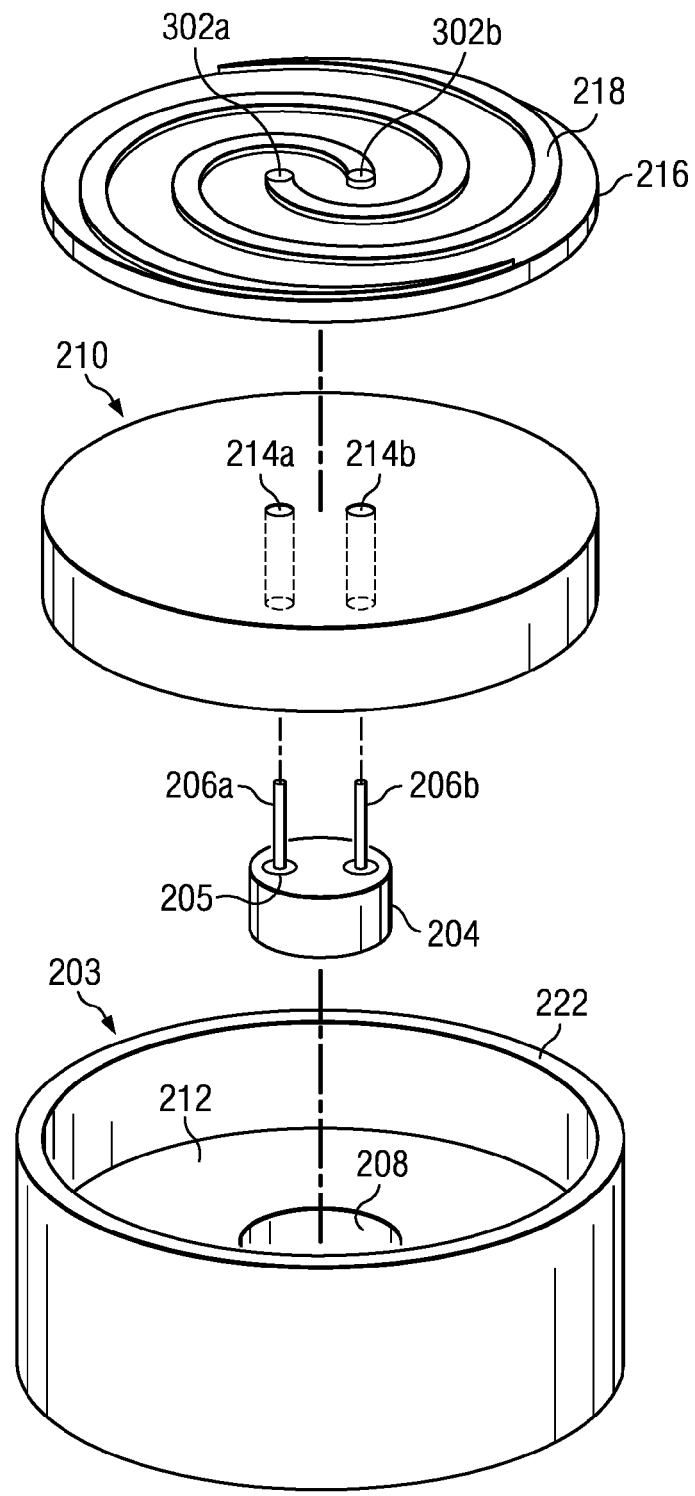
FIG. 3 is a perspective breakout view of an exemplary surface acoustic wave tagging device.

Referring now to FIG. 3, an exploded view of interior elements of an exemplary SAW tagging device is shown. The metallic base 206, which is both mechanically strong and solderable (and in some embodiments not magnetic) comprises a lower inner cavity 208 that is cylindrical in shape and an upper inner cavity 212 that is larger than the lower cavity 208 and also cylindrical in shape. The hermetically sealed header 204 contains a SAW piezoelectric device and a small amount of space to hold a "puff" of a predetermined gas such that the predetermined gas fills a gas gap located above a surface of the SAW piezoelectric device in order to provide a transmission area for acoustic wave propagation on a surface of the SAW piezoelectric device during interrogation and operation of an exemplary SAW tagging device. The two conductive leads 206a and 206b are electrically isolated from touching the conductive exterior of the header 204 by a glass composite material 205. The glass composite material further aids in maintaining the hermetical seal of the enclosure within the header 204 so that the predetermined gas cannot escape and so as to keep contamination out and away from the SAW piezoelectric device also contained therein. When the header 204 is installed in a lower inner cavity 208, some embodiments include an adhesive or epoxy potting material placed between the header and the surface of the lower inner cavity 208.

The dielectric disk 210, which is adapted to operate as an antenna reflector in conjunction with the interior upper cavity 212 of the base 206. The dielectric disk is made of a substrate or ceramic having a high dielectric constant (high K). The conductive leads 206a and 206b are positioned to extend through the annular through holes 214a and 214b. The conductive leads 206a and 206b may further extend through the vias 302a and 302b that extend through the antenna substrate 216 so as to enable the conductive leads 206a, 206b to be electrically connected to the antenna system 218 on the top surface of the antenna substrate 216.

The antenna system 218 comprises an active antenna element or elements which are laminated to the upper or top surface of the antenna substrate 216. The antenna system 218 shown is a spiral antenna system, yet other exemplary embodiments may comprise other suitable antennas that include, but are not limited to, ceramic patch antennas, flat panel antennas, monopole antennas, dipole antennas, C-slot antennas, E-slot antennas, microchip antennas, patch antennas, choke ring antennas, etc. In some embodiments, a bonding agent (not specifically shown) is positioned about the bottom peripheral surface of the antenna substrate 216. The bonding agent affixes or attaches the bottom surface of the antenna substrate 216 to the top surface of the dielectric disk 210. The bonding agent may comprise an epoxy, heat weld or other substance that will hold the parts together and may have similar heat expansion characteristics as the ceramic disk 210 and/or the antenna substrate 216. Such a bonding agent may also be placed circumferentially about the bottom surface of the dielectric disk 210 to affix or attach the dielectric disk 210 to the upper inner cavity surface 212.

Again, after the interior elements are assembled and installed within the lower inner cavity 208 and upper inner cavity 212 of the base 206, a weld or crimp is provided about at least a portion of the top edge 222 of the cylindrical base 206 and the antenna system 218 periphery or antenna substrate 216 as the top edge 222 and the top of the antenna substrate 216/antenna system 218 are substantially coplanar. This grounds the antenna system 218 periphery to the conductive base 206. When all the interior elements are installed into the upper and lower inner cavities 212, 208, the cavities 212, 208 become substantially filled with elements establishing an embodiment having monolithic characteristics. When the components have similar coefficients of expansion and are tightly fit together the monolithic characteristics further help to minimize vibrational damage to the overall device.

Referring now to FIGS. 4A, 4B, 4C and 4D an exemplary SAW header 204 is shown. The SAW header 204 is comprised of a SAW header cover 402 and a SAW header base 404. Extending out of a SAW header base 404 are two SAW header conductive leads 206a and 206b, each SAW header conductive lead 206a, 206b is surrounded by a dielectric insulating material 406 where the conductive leads exit the base 404. The dielectric insulating material 406 is necessary so that the SAW header conductive leads 206a, 206b are not in electrical contact with the SAW header base 404, which may be made of a metal material. The top 408 of the SAW header base 404 will abut or adhesively attach to the bottom of the dielectric disk 210 (see FIG. 2) such that one or more of the conductive leads 206a, 206b can extend through the through holes 214a, 214b and the vias through the antenna substrate 216 so as to be electrically connected to the antenna system 218.

Figure 4A:
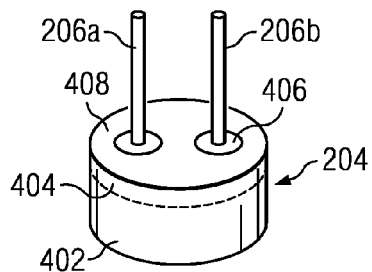
FIGS. 4A, 4B, 4C and 4D illustrate a surface acoustic wave header and exemplary components therein in accordance with an embodiment of the invention.
Figure 4B:
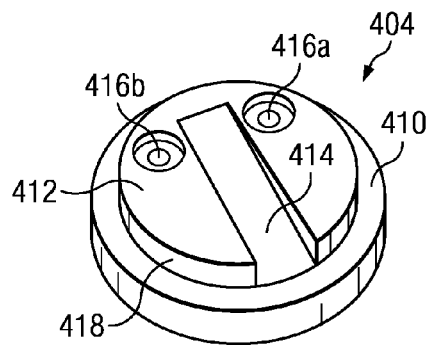
Figure 4C:
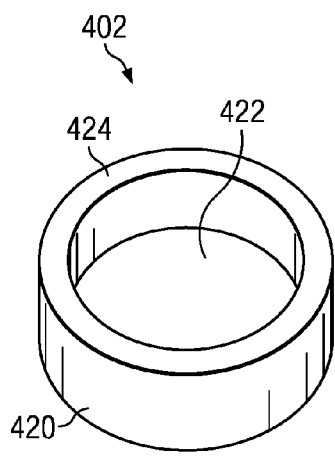

FIGS. 4B and 4C depict an exemplary SAW header 204 wherein the SAW header cover 402 and the SAW header base 404 are separated prior to assembly. The SAW header base 404 comprises a base portion with an upper lip 410 extending circumferentially about an upper surface of the header base 404. A raised plateau portion 412 extends upward from the upper lip 410. Within the raised plateau portion 412 is a SAW substrate groove 414. Two dielectric insulated through leads 416a and 416b are seen extending from near the top surface of the raised plateau 412 through to the exterior top surface 408 of the SAW header base 404. In some embodiments, the through leads 416a, 416b may be part of the conductive leads 206a, 206b.

About the periphery of the raised plateau 412 and extending downward from the top of the raised plateau 412 to the top of the upper lip 410 is a raised plateau edge 418, which defines the outer periphery of the raised plateau portion 412.

The header cover 402 comprises an upper lip 420 about its upper edge surface and a cupped hollow interior 422 such that the header cover 402 may be positioned to cover the raised plateau 412 of the header base 404. The raised plateau portion 412 substantially fills the cupped hollow interior 422 of the header cover 402 when the header cover 402 and base 404 are pressed together. Furthermore, when the header cover 402 press-fit toward the raised plateau 412, the header cover upper lip 420 and inner side surface 424 engage the header base upper lip 410 and the raised plateau edge 418 of the header base 404 in a compressed fashion thereby establishing a hermetic seal between the header base 404 and the header cover 402. The hermetic seal between the header base 404 and header cover 402 seals the interior portion of the SAW header 204 from contamination by elements outside of the SAW header 204. In some embodiments the cover 402 and base 404 are heat or ultrasonic welded together.

Figure 4D:
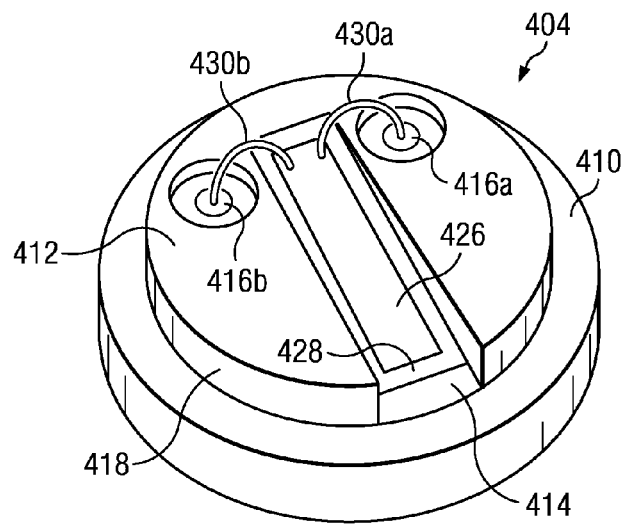

Referring to FIG. 4D, the header base 404 is shown with a SAW piezoelectric device 426 installed in the SAW substrate groove 414. A bonding agent 428 is used to bond the SAW piezoelectric device 426 into the SAW substrate groove 414. Wire bonds 430a and 430b electrically connect the SAW piezoelectric device 426 to the conductive through leads 416a and 416b within the dielectric insulating material.

Thus, an exemplary SAW tagging device may comprise a header 204. The header 204 may comprise a base 404 having a SAW piezoelectric device 426 installed therein via a bonding agent 428. The SAW piezoelectric device 426 may be connected, via bonding wires, 430a and 430b to the conductive part of dielectric insulated through leads 416a and 416b, respectively. An exemplary header cover 402 may be compressively attached to the header base 404 such that the raised plateau 412 is positioned inside a cupped hollow interior 422 of the header cover 402. Prior to compressively attaching the header cover 402 to the base 404, a "puff" of a predetermined gas is provided to fill or partially fill the area about or above the SAW piezoelectric device 426. The predetermined gas (not specifically shown) may be helium, nitrogen or other gasses that may exhibit minimal expansion and/or contraction over the operating temperature of an exemplary tagging transponder device. Furthermore, in some embodiments gasses or combinations of different types of gasses may be used regardless of the expansion or contraction properties over the temperature range due to the very small amount of area (as small as few cubic millimeters) wherein the gas is contained. The raised plateau edge 418 is compressively engaged with the inner side surface 424 of the header cover 402 such that the upper lip 420 of the cover 402 and the upper lip 410 of the base 404 are also engaged. The combination of the raised plateau edge being compressively fit into the cupper hollow interior 422 until the upper lips of both parts 410, 420 are firmly engaged establishes a hermetic seal between a header cover 402 and base 404. The SAW piezoelectric device 426 is contained within the hermetically sealed SAW header 204. One of the SAW header leads 206a is electrically connected to an antenna connection 302a through a first dielectric disk annular through hole 214a. The second SAW header lead 206b is electrically connected to the second antenna connection 302b by way of the second dielectric disk annular through hole 214b. In some embodiments, the SAW header 204 is also mechanically or chemically bonded to the bottom side of the dielectric disk 210 and/or the inside of the lower inner cavity 208.

Figure 5:
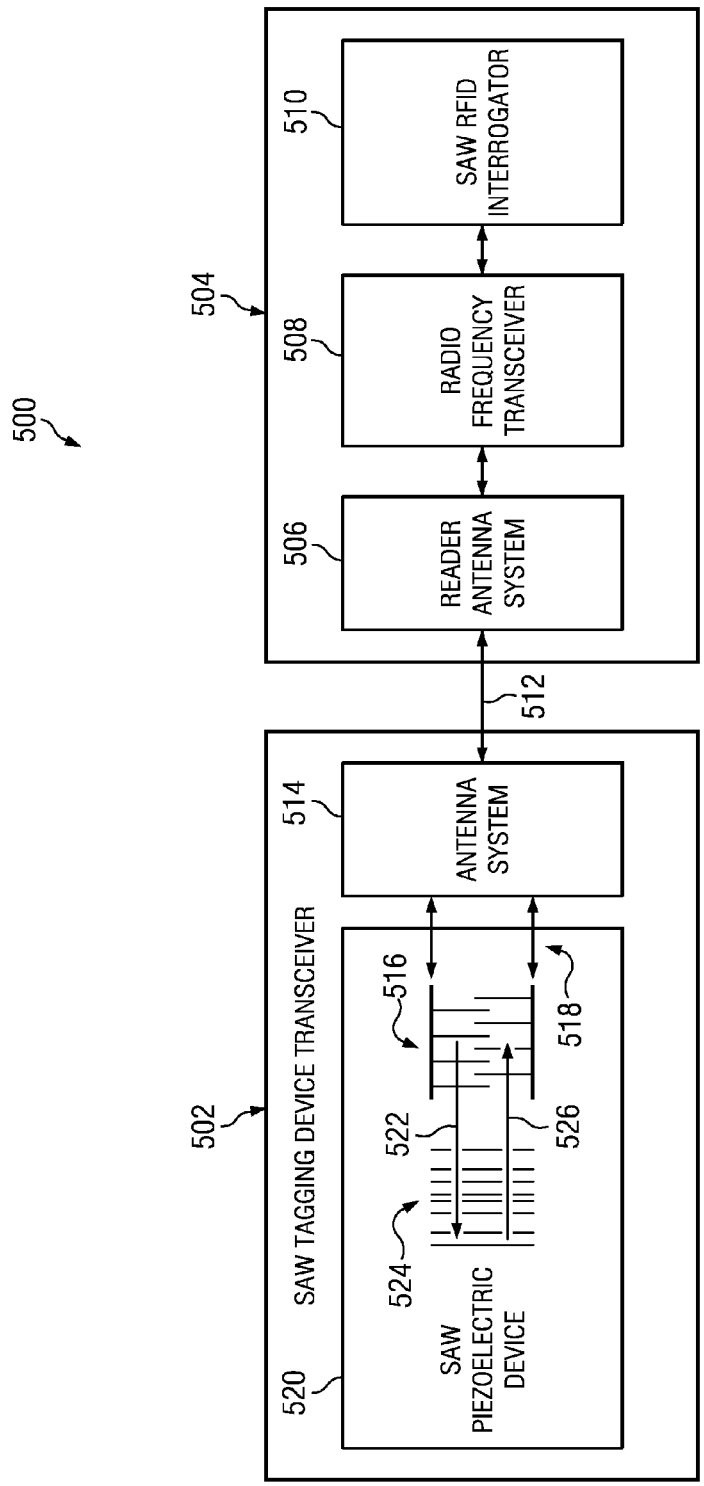
FIG. 5 illustrates an exemplary flow diagram of RF communications between an exemplary surface acoustic wave tagging device and an exemplary surface acoustic wave interrogating system in accordance with an embodiment of the invention.

Referring now to FIG. 5, a flow diagram and method of an exemplary system 500 that utilizes a SAW piezoelectric device installed in an exemplary SAW tagging device 502 is illustrated. Here, a SAW tagging device 502 is depicted interacting with a SAW or interrogator 504. The SAW reader or interrogator device 504 may comprise, for example, an antenna system 506, a radio frequency transceiver 508 and a SAW frequency interrogator 510. Radio frequency energy 512 is exchanged between the SAW tagging device's antenna system 514 and the reader antenna system 506. The radio frequency energy received at the SAW tagging device's antenna system 514 is provided to the SAW inter-digital transducer 516 via connections 518. The connections 518 may coincide, for example to the conductive lead wires 206a, 206b and/or the bond wires 430a, 430b that electrically connect an exemplary antenna system 218 to the SAW piezoelectric device 426 in an exemplary embodiment. In the SAW piezoelectric device 520, the inter-digital transducer 516 converts the radio frequency energy received from the antenna system 514 to a SAW 522 (shown as an arrow in the figures), which propagates over the delay lines 524. The delay lines 524 encode the SAW 522 into a return acoustic wave 526 that comprises a predetermined signal or data. The encoded return acoustic wave 526 is then converted back into radio frequency energy by the inter-digital transducer 516. The return signal or data, which is now in the form of radio frequency energy, is then provided to the antenna system 514 by connections 518 and transmitted as a radio frequency signal 512 back to the reader antenna system 506. A radio frequency transceiver 508 receives the encoded return signal from the reader antenna system 806 and in turn provides the signal or data encoded in the signal to the SAW RFID interrogator 510 wherein the encoded return signal or data is decoded for use by other electronics such as an asset inventory system (not specifically shown).

Some exemplary SAW tagging device specifications associated with various embodiments of the invention provide that the operating frequency of an exemplary SAW piezoelectric device, within an exemplary SAW tagging device, may be in the range of 2.45 GHz ISM Band (+/−50 MHz). Furthermore, the operating temperature of various exemplary devices may be in the range of between about −55° to 350° C. (−67° to about 662° F.). When using a 10 dBm SAW reader an exemplary SAW tagging device may communicate with the reader at a distance of up to and including about 6 to 8 feet. An exemplary device can withstand hydrostatic pressure up to and including about 20,000 PSI (1,379 BAR). Furthermore, embodiments of the invention are chemically resistant to sea water, hydrogen sulfide, carbon dioxide, nitrogen, bromine, chloride and the various drilling fluids used in present-day oil and gas exploration. Additionally, embodiments of the invention are designed to operate and resist failure when subjected to vibrations of 30 g, side sweep at 5-1000 Hz or shock of 100 g provided via a 1 ms half sine. Furthermore, embodiments of the invention can withstand an annular velocity such as those endured on a spinning down-hole tubular asset, of up to about 120 RPM.

It will be appreciated by those skilled in the art having the benefit of this disclosure that embodiments of the disclosed Surface Acoustic Wave resonator for down-hole applications or SAW tagging device provides a rugged, sturdy and useful asset and instrument tagging device that can withstand the various, often extreme temperatures, pressures, vibrations, blunt impacts as well as the caustic environment associated with down-hole drilling encountered in the oil and gas exploration industry while providing a means for containing an operational SAW piezoelectric device that can be easily read for tagging and tracking assets in a variety of useful ways. It should be understood that although illustrated embodiments of the invention have been described in the foregoing description is not intended to limit the scope of the invention. Various modifications and combinations of the invention embodiments as well as other embodiments of the invention will be apparent to person skilled in the art upon reference to the above description and figures. It should further be understood that the drawings and detailed description herein are to be regarded in an illustrative rather than a restrictive manner, and are not intended to be limiting to the particular forms and examples disclosed. On the contrary, included are further modifications, changes, rearrangements, substitutions, alternatives, design choices and embodiments apparent to those of ordinary skill in the art without departing from the underlying concepts and scope hereof, as defined by the following claims. Thus, it is intended that the following claims be interpreted to embrace all such further modifications, changes, rearrangements, substitutions, alternatives, design choices and embodiments.

What is claimed is:

1. A surface acoustic wave (SAW) tagging device comprising:
    a base comprising a lower cavity and an upper cavity being adjacent to each other, the base comprising an electrically conductive material;
    a dielectric disk having a lower surface and an upper surface, the dielectric disk adapted to fit in the upper cavity, the dielectric disk comprising a first through hole extending from the lower surface to the upper surface of the dielectric disk;
    an antenna substrate having a top surface and a bottom surface, the antenna substrate comprising a first via extending from the top surface to the bottom surface, the antenna substrate being adapted to fit in the upper cavity and on top of the dielectric disk;
    an antenna system on the top surface of the antenna substrate;
    a hermetically sealed enclosure comprising a SAW piezoelectric device in an interior of the enclosure and at least one electrically conductive connection extending from the interior of the enclosure to the exterior of the hermetically sealed enclosure, a first electrically conductive connection of the at least one electrically conductive connection being electrically connected to the SAW piezoelectric device; the hermetically sealed enclosure being adapted to fit in the lower cavity in a position below and adjacent to the dielectric disk such that the first conductive connection extends through the first through hole and through the first via to electrically connect to the antenna system; and
    a radio frequency transparent material on the exterior surfaces of base, the antenna substrate, the antenna system.

2. The tagging device of claim 1, further comprising a grooved compressible ring about an exterior surface of the radio frequency transparent material.

3. The tagging device of claim 2, wherein the tagging device is adapted to be compression fit into a bore hole of an asset such that the grooved compressible ring is compressed.

4. The tagging device of claim 2, further comprising an electrical connection between the antenna system and the base.

5. The tagging device of claim 4, wherein the radio frequency transparent material is electrically conductive and the grooved compressible ring is electrically conductive thereby establishing a ground path from the antenna system to the base to the radio frequency transparent material to the grooved compressible ring.

6. The tagging device of claim 1, wherein the radio frequency transparent material is transparent to a radio frequency at which the SAW piezoelectric device is adapted to receive or transmit.

7. The tagging device of claim 1, wherein the radio frequency transparent material is resistant to temperatures between about −55° to about 350° C. (−67° to about 662° F).

8. The tagging device of claim 7, wherein the base, the hermetically sealed enclosure, the dielectric disk, the antenna substrate and antenna system are positioned to create monolithic characteristics in the tagging device.

9. The tagging device of claim 8, wherein the radio frequency transparent material conducts electricity.

10. The tagging device of claim 8, further comprising a grooved compressible sleeve about a circumference of the radio frequency transparent material.

11. The tagging device of claim 10, wherein the base comprises a cylindrical shape and the open end of the cavity is at one end of the cylindrical shape.

12. The tagging device of claim 10, wherein the base comprises a metal alloy and conducts electricity.

13. The tagging device of claim 8, wherein the construction having monolithic characteristics further comprises a base having at least one interior cavity adapted to contain the antenna system, the antenna substrate, the dielectric disk and the hermetically sealed surface acoustic wave piezoelectric device wherein the antenna system is proximate to an open end of the cavity.

14. The tagging device of claim 8, wherein the dielectric disk is adapted to operate as an antenna reflector.

15. The tagging device of claim 14, wherein the base is an electrically conductive material and the antenna system is adapted to be grounded to the open end the cavity.

16. The tagging device of claim 1, wherein the base comprises a metal alloy.

17. A surface acoustic wave transponder tagging device comprising:
    a construction having monolithic characteristics comprising an antenna system on top of an antenna substrate on top of a dielectric disk on top of a hermetically sealed surface acoustic wave piezoelectric device, wherein the surface acoustic wave piezoelectric device is electrically connected to the antenna system; and
    a radio frequency transparent material encasing the construction having monolithic characteristics, the radio frequency transparent material being transparent to a radio frequency to which the surface acoustic wave piezoelectric device receives or transmits.

18. A surface acoustic wave tagging device comprising:
a surface acoustic wave piezoelectric device hermetically sealed within the surface acoustic wave tagging device;
a structure having substantially monolithic characteristics comprising:
  a cylindrical base comprising a cavity having an open end of the cavity at one end of the cylindrical base;
  an antenna system on a top surface of an antenna substrate positioned at the open end of the cavity; and
  a dielectric disk positioned inside the cavity and against a bottom surface of the antenna substrate; and
a radio frequency transparent material encasing the substantially monolithic structure; and wherein the surface acoustic wave piezoelectric device is electrically connected to the antenna system.

19. The tagging device of claim 18, wherein the radio frequency transparent material is electrically conductive and in conductive contact with the base.

* * * * *